United States Patent
Chen et al.

(10) Patent No.: US 11,991,891 B2
(45) Date of Patent: May 21, 2024

(54) DISPLAY SUBSTRATE AND MANUFACTURING METHOD THEREFOR, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Zhuo Chen, Beijing (CN); Siyi Yin, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 641 days.

(21) Appl. No.: 17/266,673

(22) PCT Filed: Feb. 21, 2020

(86) PCT No.: PCT/CN2020/076173
§ 371 (c)(1),
(2) Date: Feb. 8, 2021

(87) PCT Pub. No.: WO2020/215868
PCT Pub. Date: Oct. 29, 2020

(65) Prior Publication Data
US 2021/0305527 A1    Sep. 30, 2021

(30) Foreign Application Priority Data
Apr. 23, 2019 (CN) .......................... 201910327425.6

(51) Int. Cl.
*H01L 51/50* (2006.01)
*H10K 50/115* (2023.01)
(Continued)

(52) U.S. Cl.
CPC ......... *H10K 50/115* (2023.02); *H10K 50/844* (2023.02); *H10K 50/865* (2023.02); *H10K 71/00* (2023.02)

(58) Field of Classification Search
CPC .......................... H10K 50/115; H10K 50/865
See application file for complete search history.

(56) References Cited

U.S. PATENT DOCUMENTS

2009/0066259 A1    3/2009  Hwang et al.
2017/0338290 A1   11/2017  Liu et al.
(Continued)

FOREIGN PATENT DOCUMENTS

CN    103258965 A    8/2013
CN    105739167 A    7/2016
(Continued)

OTHER PUBLICATIONS

First office action of Chinese application No. 201910327425.6 dated Mar. 12, 2020.
(Continued)

*Primary Examiner* — Anthony Ho
(74) *Attorney, Agent, or Firm* — Lippes Mathias LLP

(57) ABSTRACT

Disclosed are a display substrate and a method for manufacturing the same, and a display device, belonging to the technical field of display. The display substrate includes: a base substrate, an electroluminescent device layer on the base substrate, and a light-absorbing layer on a light-emitting side of the electroluminescent device layer, wherein the electroluminescent device layer is configured to emit initial light of a first color, wherein the initial light forms target light after passing through the light-absorbing layer, and a full width at half maximum of an emission spectrum of the initial light is greater than a full width at half maximum of an emission spectrum of the target light. According to the
(Continued)

present disclosure, the display device is provided with a wider color gamut.

18 Claims, 5 Drawing Sheets

(51) Int. Cl.
    *H10K 50/844* (2023.01)
    *H10K 50/86* (2023.01)
    *H10K 71/00* (2023.01)

(56) References Cited

U.S. PATENT DOCUMENTS

2018/0239196 A1    8/2018    Zhou et al.
2019/0113664 A1    4/2019    Yoshikawa et al.

FOREIGN PATENT DOCUMENTS

| CN | 108780167 A | 11/2018 |
| CN | 110048024 A | 7/2019 |
| IN | 105932038 A | 9/2016 |

OTHER PUBLICATIONS

Second office action of Chinese application No. 201910327425.6 dated Sep. 21, 2020.
Third office action of Chinese application No. 201910327425.6 dated Feb. 5, 2021.
Notification to grant patent right for invention of Chinese application No. 201910327425.6 dated Jul. 1, 2021.

DISPLAY SUBSTRATE AND MANUFACTURING METHOD THEREFOR, AND DISPLAY DEVICE

CROSS-REFERENCE TO RELATED APPLICATION

This application is a 371 of PCT Patent Application Serial No. PCT/CN2020/076173 filed on Feb. 21, 2020, which claims priority to Chinese Patent Application No. 201910327425.6, filed on Apr. 23, 2019 and entitled "DISPLAY SUBSTRATE AND MANUFACTURING METHOD THEREFOR, AND DISPLAY DEVICE," the entire content of which is incorporated herein by reference.

TECHNICAL FIELD

The present disclosure relates to the technical field of display, and more particularly, relates to a display substrate and a method for manufacturing the same, and a display device.

BACKGROUND

The quantum dot is a synthesized semiconductor nanostructure. Currently, quantum dot light-emitting diode (QLED) display devices are more and more popular in people's lives. The synthesis process of the quantum dot generally includes a nucleation process and a growth process. The nucleation process is used for forming a crystal nucleus, and a particle size of the quantum dot is increased in the nucleation process. In the growth process, the crystal nucleus grows into a crystal. The nucleation process of the quantum dot is isolated from the growth process of the quantum dot, the particle size of the quantum dot may be accurately controlled, and a full width at half maximum of an emission spectrum of the quantum dot may be controlled, such that a color gamut of the QLED display device is controlled.

The value of the full width at half maximum of an emission spectrum of the quantum dot may be used for representing the particle size distribution of the quantum dots; and when the distribution range of the particle size of the quantum dots is broader, the full width at half maximum of the emission spectrum of the quantum dot is greater and the color gamut of the quantum dot is narrower. The full width at half maximum of the emission spectrum refers to a peak width of an emission spectrum of which an amplitude is equal to half of the maximum height of the emission spectrum in the emission spectrum.

SUMMARY

Embodiments of the present disclosure provide a display substrate and a method for manufacturing the same, and a display device. The technical solutions are as follows:

In a first aspect, a display substrate is provided. The display panel includes:
a base substrate, an electroluminescent device layer on the base substrate, and a light-absorbing layer on a light-emitting side of the electroluminescent device layer; wherein
the electroluminescent device layer is configured to emit initial light of a first color, wherein the initial light forms target light after passing through the light-absorbing layer, and a full width at half maximum of an emission spectrum of the initial light is greater than a full width at half maximum of an emission spectrum of the target light.

Optionally, the light-absorbing layer is on a side, distal from the base substrate, of the electroluminescent device layer.

Optionally, the display substrate further includes: a package structure layer on a side, distal from the base substrate, of the electroluminescent device layer, wherein the light-absorbing layer is in the package structure layer.

Optionally, a material of the light-absorbing layer includes a light-absorbing material, wherein the package structure layer is doped with the light-absorbing material.

Optionally, the package structure layer includes: an inorganic layer and an organic layer that are stacked alternately, wherein the organic layer is doped with the light-absorbing material.

Optionally, the package structure layer includes: a plurality of sub-package structure layers, wherein the light-absorbing layer is between two of the plurality of sub-package structure layers.

Optionally, the display substrate further includes: a package structure layer on the side, distal from the base substrate, of the electroluminescent device layer, wherein the light-absorbing layer is on the side, distal from the base substrate, of the package structure layer.

Optionally, the display substrate further includes: a package structure layer on a side, distal from the base substrate, of the light-absorbing layer.

Optionally, the light-absorbing layer is on a side, proximal to the base substrate, of the electroluminescent device layer.

Optionally, a material of the light-absorbing layer includes a light-absorbing material, and the display substrate further includes: a planarization layer between the base substrate and the electroluminescent device layer, wherein the planarization layer is doped with the light-absorbing material.

Optionally, the light-absorbing layer is on a side, distal from the base substrate, of the electroluminescent device layer, or the light-absorbing layer is between the electroluminescent device layer and the base substrate.

Optionally, the display substrate further includes: a planarization layer on a side, proximal to the electroluminescent device layer, of the base substrate, wherein the light-absorbing layer is between the planarization layer and the electroluminescent device layer.

Optionally, the display substrate further includes: a planarization layer on the side, proximal to the base substrate, of the electroluminescent device layer, wherein the light-absorbing layer is between the planarization layer and the base substrate.

Optionally, an absorption spectrum of the light-absorbing layer includes a shoulder peak of an emission spectrum of the initial light.

Optionally, the electroluminescent device layer includes: a red light-emitting unit and/or a green light-emitting unit and/or a blue light-emitting unit; wherein
a peak wavelength of an emission spectrum of the red light-emitting unit is 625 nanometers, and a full width at half maximum of the emission spectrum of the red light-emitting unit is 55 nanometers; and/or
a peak wavelength of an emission spectrum of the green light-emitting unit is 525 nanometers, and a full width at half maximum of the emission spectrum of the green light-emitting unit is 55 nanometers; and/or
a peak wavelength of an emission spectrum of the blue light-emitting unit is 460 nanometers, and a full width at half maximum of the emission spectrum of the blue light-emitting unit is 25 nanometers; and a wavelength of an absorption peak of the light-absorbing layer includes: 500 nanometers, 550 nanometers, 600 nanometers and 650 nanometers, and a peak width of an absorption spectrum of the light-absorbing layer is 10 nanometers.

Optionally, a material of the light-absorbing layer includes a light-absorbing material, the light-absorbing material is at least one of modified anthocyanin and modified anthocyanidin, wherein the modified anthocyanin is obtained by modifying absorption peak of the anthocyanin, and the modified anthocyanidin is obtained by modifying absorption peak of the anthocyanidin.

Optionally, the electroluminescent device layer includes an indium phosphide quantum dot light-emitting diode layer or an organic light-emitting diode layer.

In a second aspect, a method for manufacturing a display substrate is provided. The method includes:

forming an electroluminescent device layer and a light-absorbing layer on the base substrate, wherein the light-absorbing layer is on a light-emitting side of the electroluminescent device layer; wherein the electroluminescent device layer is configured to emit initial light of a first color, wherein the initial light forms target light after passing through the light-absorbing layer, and a full width at half maximum of an emission spectrum of the initial light is greater than a full width at half maximum of an emission spectrum of the target light.

Optionally, forming the electroluminescent device layer and the light-absorbing layer on the base substrate includes any one of:

forming the electroluminescent device layer on the base substrate, and forming the light-absorbing layer on the base substrate on which the electroluminescent device layer is formed; and forming the light-absorbing layer on the base substrate, and forming the electroluminescent device layer on the base substrate on which the light-absorbing layer is formed.

Optionally, an absorption spectrum of the light-absorbing layer includes a shoulder peak of an emission spectrum of the initial light.

In a third aspect, a display device is provided. The display device includes: the display substrate according to the first aspect.

It should be understood that the above general description and the following detailed description are exemplary only but are not intended to limit the present disclosure.

BRIEF DESCRIPTION OF THE ACCOMPANYING DRAWINGS

For clearer descriptions of the embodiments of the present disclosure, the accompanying drawings required to describe the embodiments are briefly described hereinafter. Apparently, the accompanying drawings described below are merely some embodiments of the present disclosure, and a person of ordinary skill in the art may obtain other accompanying drawings according to these accompanying drawings without paying any creative efforts.

Figure 1:
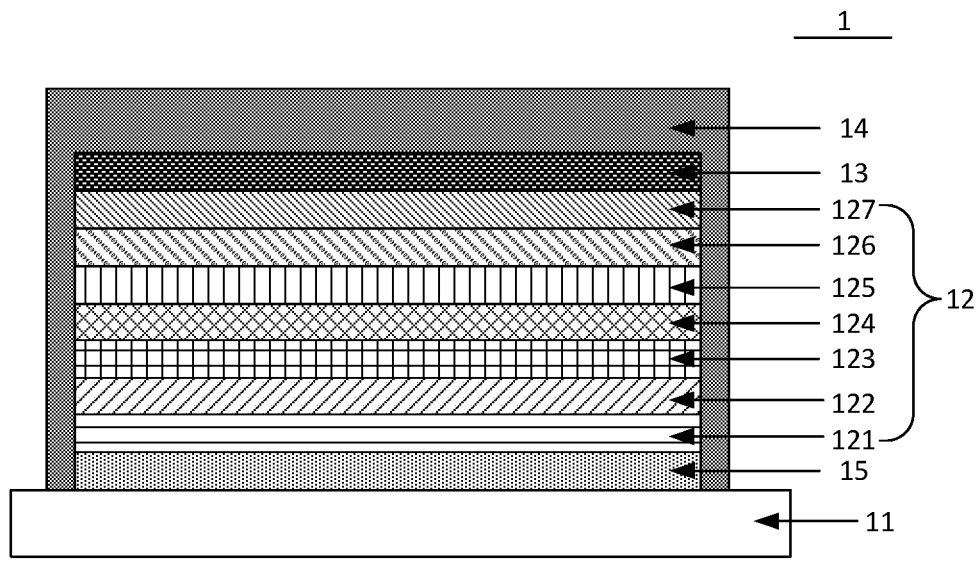
FIG. 1 is a schematic structural diagram of a display substrate according to an embodiment of the present disclosure.

The accompanying drawings, which are incorporated in and constitute a part of this specification, illustrate embodiments consistent with the present disclosure and, together with the description, serve to explain the principles of the present disclosure.

DETAILED DESCRIPTION

For clearer descriptions of the objects, technical solutions, and advantages in the present disclosure, the present disclosure is described in detail below with reference to the accompanying drawings. Obviously, the described embodiments are merely some but not all of embodiments of the present disclosure. All other embodiments made on the basis of the embodiments of the present disclosure by a person of ordinary skill in the art without any creative effort shall be included in the protection scope of the present disclosure.

With the continuous development of a quantum dot technology and the enhancement of environmental awareness, cadmium quantum dots are gradually replaced by cadmium-free quantum dots, for example, the cadmium quantum dots are replaced by indium phosphide (InP) quantum dots. The cadmium quantum dot is a quantum dot with a material containing metal cadmium. The metal cadmium is a heavy metal, which is liable to cause environmental pollution. The InP quantum dot is a quantum dot with a material adopting InP instead of the metal cadmium.

A synthesis process of the quantum dot generally includes a nucleation process and a growth process. The nucleation process is isolated from the growth process, and a particle size of the quantum dot may be accurately controlled, thereby a full width at half maximum of an emission spectrum of the quantum dot is controlled. The particle size distribution situation of a plurality of quantum dots of light-emitting the same color may be represented by the full width at half maximum of emission spectra of the plurality of quantum dots. Furthermore, when the particle size distribution range of the plurality of quantum dots is broader, the full width at half maximum of the emission spectra of the plurality of quantum dots is greater.

However, because it is difficult to effectively isolate the nucleation process of the InP quantum dot from the growth process of the InP quantum dot, the particle size control precision of the InP quantum dot is less than the particle size control precision of the cadmium quantum dot, the particle size distribution range of the InP quantum dot is broader than the particle size distribution range of the cadmium quantum dot, and the full width at half maximum of the emission spectrum of the InP quantum dot is much greater than the full width at half maximum of the emission spectrum of the cadmium quantum dot. The light-emitting color gamut of the quantum dot is narrower (that is, the color purity is lower) when the full width at half maximum of the emission spectrum of the quantum dot is broader. Therefore, a color gamut of an InP QLED display device is much less than a color gamut of a cadmium QLED display device (a QLED display device of which a quantum dot is the cadmium quantum dot). Experiments show that the color gamut of the InP QLED display device is less than 69% of the National Television Standards Committee (NTSC) color gamut, while the color gamut of the cadmium QLED display device is greater than 100% of the NTSC color gamut.

Various embodiments of the present disclosure provide a display substrate, a method for manufacturing the same, and a display device. The display substrate may be an InP quantum dot display substrate or an organic light-emitting diode display substrate. The display substrate includes a base substrate, an electroluminescent device layer disposed on the base substrate, and a light-absorbing layer arranged on a light-emitting side of the electroluminescent device layer. An emission spectrum of the electroluminescent device layer is wider, and the light-absorbing layer may absorb part of light emitted by the electroluminescent device layer, thus a full width at half maximum of an emission spectrum of light of at least one color of the electroluminescent device layer is reduced, such that the display substrate is provided with a wider color gamut. The detailed solutions of the present disclosure are described with reference to descriptions of the following embodiments.

FIG. 1 is a schematic structural diagram of a display substrate 1 according to an embodiment of the present disclosure. As shown in FIG. 1, The display substrate 1 includes a base substrate 11, an electroluminescent device layer 12 disposed on the base substrate 11, and a light-absorbing layer 13 arranged on a light-emitting side of the electroluminescent device layer 12.

The electroluminescent device layer 12 is configured to emit initial light of a first color. The initial light of the first color forms target light of the first color after passing through the light-absorbing layer 13, and a full width at half maximum of an emission spectrum of the initial light of the first color is greater than a full width at half maximum of an emission spectrum of the target light of the first color.

Optionally, the electroluminescent device layer 12 may emit initial light of one or more colors. Exemplarily, the electroluminescent device layer 12 may be a film layer exclusively used to emit initial light of a first color. Alternatively, the electroluminescent device layer 12 may be a film layer capable of emitting initial light of a plurality of colors, and the first color is any one of the plurality of colors.

Furthermore, the full width at half maximum of the emission spectrum of the initial light of the first color may be greater than a target width threshold. At this time, the light-absorbing effect of the light-absorbing layer has a significant effect of improving the color gamut of the display substrate. The target width threshold may be determined according to application requirements. Exemplarily, the target width threshold may be 54 nanometers (nm), 50 nm, 57 nm or 60 nm.

In summary, in the display substrate according to the embodiment of the present disclosure, the light-absorbing layer is arranged on the light-emitting side of the electroluminescent device layer, and the electroluminescent device layer is configured to emit the initial light of the first color. The initial light of the first color forms the target light of the first color after passing through the light-absorbing layer, and the full width at half maximum of the emission spectrum of the target light of the first color is less than the full width at half maximum of the emission spectrum of the initial light of the first color, such that the display substrate is provided with a wider color gamut.

Optionally, a material of the light-absorbing layer 13 may include a light-absorbing material with a specific absorption peak. The light-absorbing material with the specific absorption peak may be organic dye. Exemplarily, the light-absorbing material may be at least one of modified anthocyanin and modified anthocyanidin, wherein the modified anthocyanin is obtained by modifying absorption peak of the anthocyanin, and the modified anthocyanidin is obtained by modifying absorption peak of the anthocyanidin. The modified anthocyanin and the modified anthocyanidin are rigid skeleton organic dye, of which the peak width of the absorption spectrum is narrower, such that light emission efficiency of the display substrate may be effectively ensured.

In the embodiment of the present disclosure, the electroluminescent device layer 12 may include an InP quantum dot light-emitting diode layer, and a peak width of an emission spectrum of the InP quantum dot light-emitting diode layer is narrower. Therefore, when the light-absorbing material is at least one of the modified anthocyanin and the modified anthocyanidin, excessive absorption of light emitted by the electroluminescent device layer 12 by the light-absorbing layer may be avoided, thereby avoiding the impact on the light emission efficiency of the display substrate by the light-absorbing layer.

In the embodiment of the present disclosure, the display substrate may be a top-emitting display substrate or a bottom-emitting display substrate. At this time, since it is necessary for the light-absorbing layer to absorb light emitted by the electroluminescent device layer, the light-absorbing layer may be disposed on a light-emitting side of the electroluminescent device layer.

Optionally, when the display substrate is the top-emitting display substrate, the light-absorbing layer may be disposed on a side, distal from the base substrate, of the electroluminescent device layer. In one embodiment, a film layer on a side, distal from the base substrate, of the electroluminescent device layer may be doped with a light-absorbing material, enabling the film layer to have the original function of the film layer and also be provided with a light-absorbing function. At this time, the film layer is also called a light-absorbing layer. Alternatively, a light-absorbing layer may be separately arranged on a side, distal from the base substrate, of the electroluminescent device layer.

When the display substrate is the bottom-emitting display substrate, the light-absorbing layer may be disposed between the electroluminescent device layer and the base substrate. A film layer between the electroluminescent device layer and the base substrate may be doped with a light-absorbing material, enabling the film layer to have the original function of the film layer and also be provided with a light-absorbing function. At this time, the film layer is also called a light-absorbing layer. Alternatively, a light-absorbing layer may be separately arranged between the electroluminescent device layer and the base substrate.

It should be noted that when the light-absorbing layer is formed by doping the light-absorbing material in the film layer, since a film layer is not required to be added in the display substrate in this embodiment, a manufacturing process in this embodiment is simple. Moreover, in this embodiment, if the light-absorbing material is an organic material, the film layer doped with the light-absorbing material may be an organic film layer, and at this time, the process difficulty in this embodiment can be reduced.

The solutions of the embodiments of the present disclosure are illustrated by taking four cases of the light-absorbing layer as examples.

In the first case, the display substrate is the top-emitting display substrate, and the light-absorbing layer is separately arranged on a side, distal from the base substrate, of the electroluminescent device layer.

FIG. 1 is a schematic structural diagram of a display substrate 1 according to an embodiment of the present disclosure in the first case. As shown in FIG. 1, the display substrate 1 includes a base substrate 11, a planarization layer 15 disposed on the base substrate 11, an electroluminescent device layer 12 disposed on a side, distal from the base substrate 11, of the planarization layer 15, a light-absorbing layer 13 disposed on a side, distal from the base substrate 11, of the electroluminescent device layer 12, and a package structure layer 14 disposed on a side, distal from the base substrate 11, of the light-absorbing layer 13. The package structure layer 14 is configured to prevent oxygen and wet gas from permeating into a display area of the display substrate to ensure normal use of a display function of the display substrate. In FIG. 1, the light-absorbing layer 13 is a film layer arranged separately, that is, the light-absorbing layer 13 is a film layer which is formed by coating a side, distal from the base substrate 11, of the electroluminescent device layer 12 with a light-absorbing material.

For the first case, a material of the light-absorbing layer 13 may further include a clear adhesive material. When the light-absorbing layer 13 is manufactured, the light-absorbing material and the clear adhesive material may be mixed to obtain a mixed material, and the side, distal from the base substrate 11, of the electroluminescent device layer 12 is coated with the mixed material, thereby forming the light-absorbing layer 13.

The package structure layer 14 may be disposed on a side, distal from the base substrate 11, of the electroluminescent device layer 12, and the light-absorbing layer 13 is disposed on a side, distal from the base substrate 11, of the package structure layer 14. At this time, a side, distal from the base substrate 11, of the package structure layer 14 may be coated with the mixed material to form the light-absorbing layer 13.

Alternatively, the package structure layer 14 may include: a plurality of sub-package structure layers 14. At this time, the light-absorbing layer 13 may be disposed between two of the plurality of sub-package structure layers 14. The plurality of sub-package structure layers 14 may be an inorganic layer and an organic layer that are stacked alternately. At this time, the light absorbing layer 13 may be disposed between one inorganic layer and one organic layer of the plurality of sub-package structure layers 14.

As used herein, the singular forms "a," "an," and "the" include both singular and plural referents unless the context clearly dictates otherwise. Thus, for example, reference to "an inorganic layer and an organic layer that are stacked alternately" includes an inorganic layer and an organic layer that are stacked alternately, an inorganic layer, an organic layer and an inorganic layer that are stacked alternately, an inorganic layer, an organic layer, an inorganic layer and an organic layer that are stacked alternately, and the like. In addition, when an inorganic layer and an organic layer that are stacked alternately, the inorganic layer is closer to electroluminescent device layer 12 than the organic layer is, wherein the inorganic layer is used to isolate the water and oxygen, and the organic layer is used to fill the gap.

It should be noted that when, in addition to the package structure layer 14, the display substrate further includes other film layers disposed on a side, distal from the base substrate 11, of the electroluminescent device layer 12, practice of the light-absorbing layer 13 may be correspondingly referenced to those in the first case, which is not described herein again.

In the second case, the display substrate is the top-emitting display substrate, a light-absorbing material is doped into a film layer on a side, distal from the base substrate, of the electroluminescent device layer, and the film layer doped with the light-absorbing material is also called a light-absorbing layer.

Figure 2:
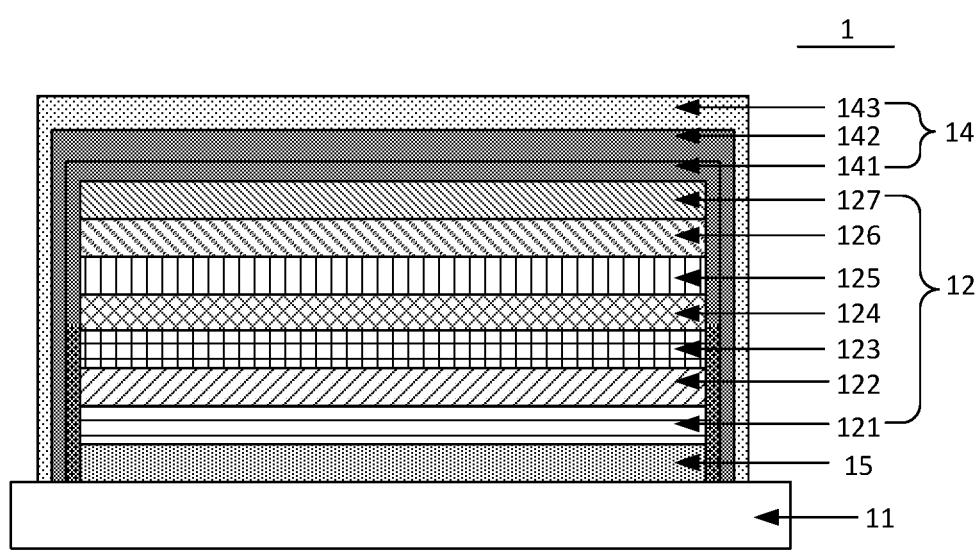
FIG. 2 is a schematic structural diagram of another display substrate according to an embodiment of the present disclosure.

Exemplarily, FIG. 2 is a schematic structural diagram of another display substrate 1 according to an embodiment of the present disclosure in the second case. As shown in FIG. 2, the display substrate 1 includes a base substrate 11, a planarization layer 15 disposed on the base substrate 11, an electroluminescent device layer 12 disposed on a side, distal from the base substrate 11, of the planarization layer 15, and a package structure layer 14 disposed on a side, distal from the base substrate 11, of the electroluminescent device layer 12, wherein a light-absorbing layer may be disposed in the package structure layer 14.

Optionally, the package structure layer 14 may be doped with a light-absorbing material, such that the light-absorbing layer may be disposed in the package structure layer 14. Furthermore, when the light-absorbing material is an organic material, the light-absorbing material may be doped in an organic film layer for reducing the difficulty of practicing the light-absorbing layer. For example, when being a thin film packaging (TFE) layer, the package structure layer 14 includes an inorganic layer and an organic layer that are stacked alternately. At this time, the organic layer of the package structure layer 14 may be doped with the light-absorbing material, that is, the organic layer has the original function of the organic layer, and also be provided with a light-absorbing function. Accordingly, the organic layer doped with the light-absorbing material is also called a light-absorbing layer. Exemplarily, as shown in FIG. 2, the package structure layer 14 may include an inorganic layer 141, an organic layer 142 and an inorganic layer 143 that are stacked alternately, wherein the organic layer 142 is doped with a light-absorbing material, such that the organic layer 142 is provided with light-absorbing effects, that is, the organic layer 142 is also called a light-absorbing layer.

It should be noted that when, in addition to the package structure layer 14, the display substrate further includes other film layers disposed on a side, distal from the base substrate 11, of the electroluminescent device layer 12, practice of the light-absorbing layer 13 may be correspondingly referenced to those in the second case, which is not described herein again.

In the third case: the display substrate is the bottom-emitting display substrate, and the light-absorbing layer is separately arranged between the electroluminescent device layer and the base substrate.

Figure 3:
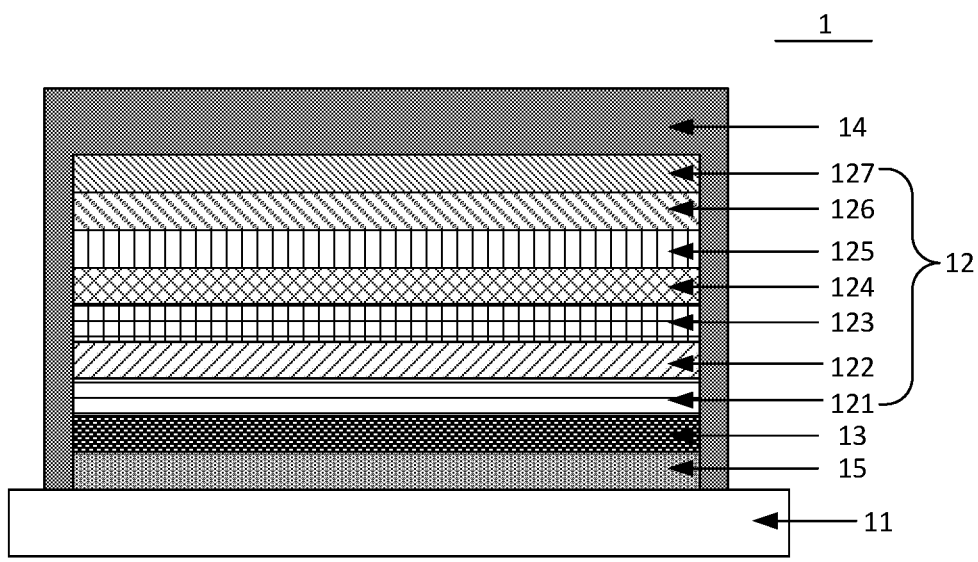
FIG. 3 is a schematic structural diagram of still another display substrate according to an embodiment of the present disclosure.

FIG. 3 is a schematic structural diagram of yet another display substrate 1 according to an embodiment of the present disclosure in the third case. As shown in FIG. 3, the display substrate 1 includes a base substrate 11, a planarization layer 15 disposed on the base substrate 11, a light-absorbing layer 13 disposed on a side, distal from the base substrate 11, of the planarization layer 15, an electroluminescent device layer 12 disposed on a side, distal from the base substrate 11, of the light-absorbing layer 13, and a package structure layer 14 disposed on a side, distal from the base substrate 11, of the electroluminescent device layer 12. In FIG. 3, the light-absorbing layer 13 is a film layer separately arranged, that is, the light-absorbing layer 13 is a film layer which is formed by coating the base substrate 11 with a light-absorbing material.

For the third case, a material of the light-absorbing layer 13 may further include a clear adhesive material. When the light-absorbing layer 13 is manufactured, the light-absorbing material and the clear adhesive material may be mixed to obtain a mixed material, and the base substrate 11 is coated with the mixed material, thereby forming the light-absorbing layer 13.

Alternatively, the light-absorbing layer 13 may be disposed on a side, proximal to the base substrate 11, of the planarization layer 15, and the planarization layer 15 is disposed on a side, proximal to the base substrate 11, of the electroluminescent device layer 12. At this time, a side of the base substrate 11 may be coated with the mixed material to form the light-absorbing layer 13.

It should be noted that when, in addition to the planarization layer 15, the display substrate further includes other film layers disposed on between the base substrate 11 and the electroluminescent device layer 12, practice of the light-absorbing layer 13 may be correspondingly referenced to those in the third case, which is not described herein again.

In the fourth case: the display substrate is the bottom-emitting display substrate, a film layer between the electroluminescent device layer and the base substrate is doped with a light-absorbing material, and the film layer doped with the light-absorbing material is also called a light-absorbing layer.

Figure 4:
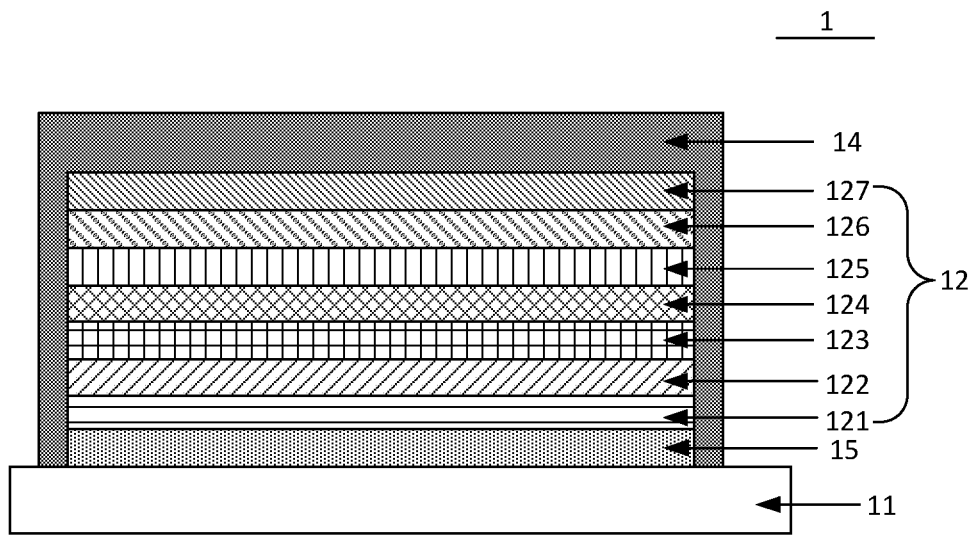
FIG. 4 is a schematic structural diagram of yet another display substrate according to an embodiment of the present disclosure.

Exemplarily, FIG. 4 is a schematic structural diagram of yet another display substrate 1 according to an embodiment of the present disclosure in the fourth case. As shown in FIG. 4, the display substrate 1 includes a base substrate 11, a planarization layer 15 disposed on the base substrate 11, and an electroluminescent device layer 12 disposed on a side, distal from the base substrate 11, of the planarization layer 15, wherein a light-absorbing material is doped in the planarization layer 15, such that the planarization layer 15 has the original function of the planarization layer 15 and also be provided with a light-absorbing function, that is, the planarization layer is also called a light-absorbing layer. Optionally, a material of the planarization layer 15 may include resin. Therefore, in some scenes, the planarization layer 15 is also called a resin layer.

It should be noted that when, in addition to the planarization layer 15, the display substrate further includes other film layers between the electroluminescent device layer 12 and the base substrate 11, practice of the light-absorbing layer 13 may be correspondingly referenced to the that in the fourth case, which is not described herein again.

It should be noted that as shown in FIG. 1 to FIG. 4, for each of the above four possible cases, the display substrate 1 may include a base substrate 11, and a planarization layer 15, an electroluminescent device layer 12 and a package structure layer 14 which are stacked sequentially on the base substrate 11. The difference is that each of the display substrates 1 in the first case and the third case further includes a light-absorbing layer 13 arranged separately, the package structure layer 14 of the display substrate 1 in the second case is doped with a light-absorbing material, and the planarization layer 15 of the display substrate 1 in the fourth case is doped with a light-absorbing material. The package structure layer 14 in each of the display substrates 1 in the four cases may be a thin film package layer or a package cover plate.

It should further be noted that for the second case and the fourth case, since the light-absorbing material may be doped in the film layer (for example, the above package structure layer 14 or the planarization layer 15) on the light-emitting side of the electroluminescent device layer, the film layer doped with the light-absorbing material serves as the light-absorbing layer and the light-absorbing layer is not required to be separately arranged, thereby simplifying the structure of the display substrate and reducing the process difficulty of manufacturing the display substrate.

Optionally, as shown in FIG. 1 to FIG. 4, in the embodiment of the present disclosure, the electroluminescent device layer 12 may include a first electrode layer 121, a hole injection layer (HIL) 122, a hole transport layer (HTL) 123, an emission layer (EML) 124, an electron transport layer (EHL) 125, an electron injection layer (EIL) 126 and a second electrode layer 127 that are stacked sequentially in a direction distal from the base substrate 11. A material of the first electrode layer 121 may include indium tin oxide (ITO). A material of the hole injection layer 122 may include a hole injection material, for example, tetrafluorocyano-quinone dimethane. A material of the hole transport layer 123 may include a hole transport material, for example, poly (3, 4-ethylenedioxythiophene)/polystyrene sulfonate (PEDOT/PSS). A material of the electroluminescent device layer 124 may include an InP quantum dot material or an organic light-emitting material. A material of the electron transport layer 125 may be a zinc oxide (ZnO) nanoparticle. A material of the electron injection layer 126 may include an electron injection material, for example, coumarin 545T. A material of the second electrode layer 127 may include aluminum (Al), silver (Ag) or alloy of silver and magnesium (Mg/Ag).

In the embodiment of the present disclosure, the display substrate 1 may be an organic light-emitting diode (OLED) display substrate or a QLED display substrate. The QLED display substrate, for example, may be an InP QLED display substrate, that is, a QLED display substrate of which a quantum dot is an InP quantum dot. In the display substrate 1, the electroluminescent device layer 12 may include: a red light-emitting unit, and/or, a green light-emitting unit, and/or, a blue light-emitting unit (not shown in FIG. 1 to FIG. 4). When the display substrate 1 is the InP QLED display substrate (that is, the light-emitting unit is an InP QLED light-emitting unit), a peak wavelength of an emission spectrum of the red light-emitting unit is 625 nm and a full width at half maximum of the emission spectrum of the red light-emitting unit is 55 nm, and/or a peak wavelength of an emission spectrum of the green light-emitting unit is 525 nm and a full width at half maximum of the emission spectrum of the green light-emitting unit is 55 nm, and/or a peak wavelength of an emission spectrum of the blue light-emitting unit is 460 nm and a full width at half maximum of the emission spectrum of the red light-emitting unit is 25 nm. Taking a target width threshold is 54 nm and a target difference threshold is 20 nm as an example, in the embodiment of the present disclosure, a wavelength of an absorption peak of the light-absorbing layer (for example the light-absorbing layers 13 in FIG. 1 and FIG. 3, the organic layer 142 in FIG. 2 or the planarization layer 15 in FIG. 4) may include 500 nm, 550 nm, 600 nm and 650 nm, and at this time, the light-absorbing layer is configured to absorb light with a target wavelength in emission spectra of the red and green light-emitting units.

Furthermore, a difference value between the target wavelength of part of light of the first color absorbed by the light-absorbing layer and the peak wavelength of the emission spectrum when the initial light of the first color is not absorbed may be greater than the target difference threshold. At this time, an absorption spectrum of the light-absorbing layer 13 is a shoulder peak of the emission spectrum of the initial light of the first color.

Optionally, the target difference threshold may be determined according to application requirements. For example, the target difference threshold may include 15 nm, 20 nm, and/or 25 nm. For example, when the wavelength of the absorption peak of the light-absorbing layer 13 includes 500 nm, 550 nm, 600 nm, and 650 nm, the peak width of the absorption spectrum of the light-absorbing layer 13 may be 10 nm to enable the absorption spectrum of the light-absorbing layer 13 is the shoulder peak of the emission spectrum of the initial light of the first color.

A small non-peak zigzag which appears on a peak of a curve looks like a shoulder, thus being called a shoulder peak. The appearance of the shoulder peak indicates that a compound represented by a chromatographic peak is impure, containing a small amount of impurities. Therefore, when the absorption spectrum of the light-absorbing layer 13 is the shoulder peak of the emission spectrum of the initial light of the first color, light absorbed by the light-absorbing layer is light with low light-emitting intensity in the initial light of the first color. As the light emission efficiency (also called luminous efficiency) of the display substrate depends on the peak value of the emission spectrum of the electroluminescent device layer, it may be determined that the light-absorbing layer exerts less impact on the light emission efficiency of the display substrate, and the light emission efficiency of the display substrate may be effectively ensured.

Figure 5:
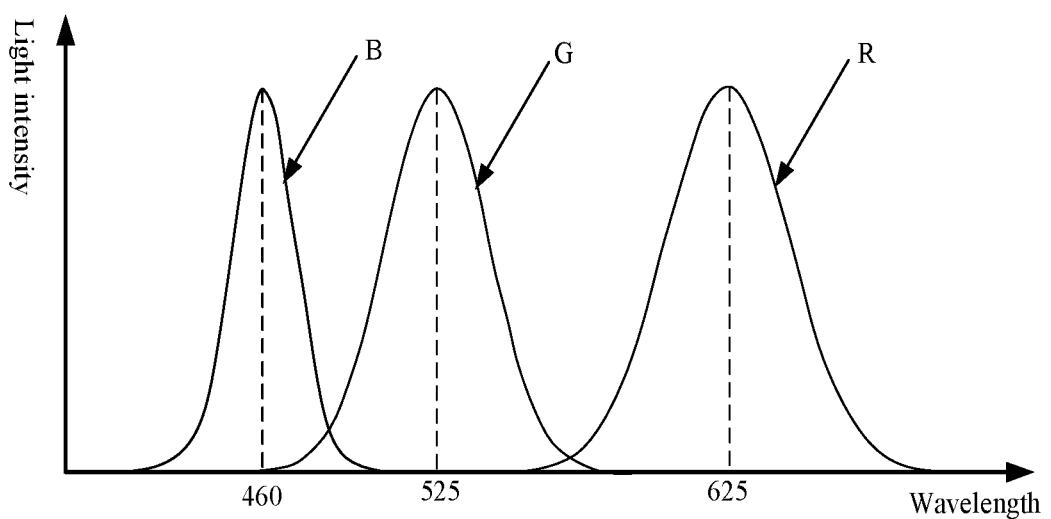
FIG. 5 is a schematic diagram of emission spectra of a red light-emitting unit, a green light-emitting unit and a blue light-emitting unit of an electroluminescent device layer according to an embodiment of the present disclosure.
Figure 6:
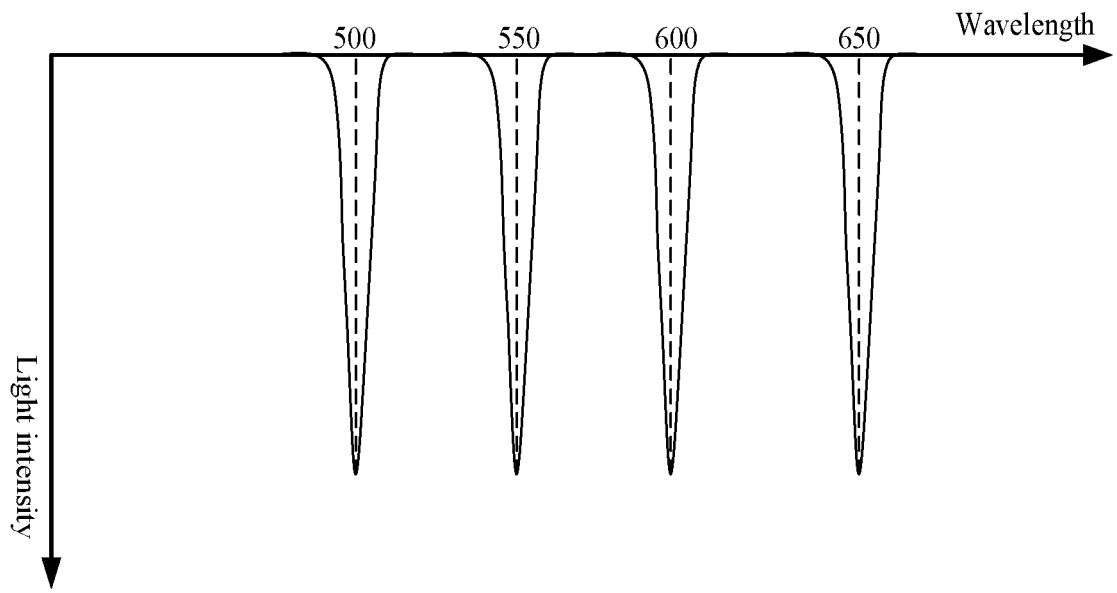
FIG. 6 is a schematic diagram of an absorption spectrum of a light-absorbing layer according to an embodiment of the disclosure.
Figure 7:
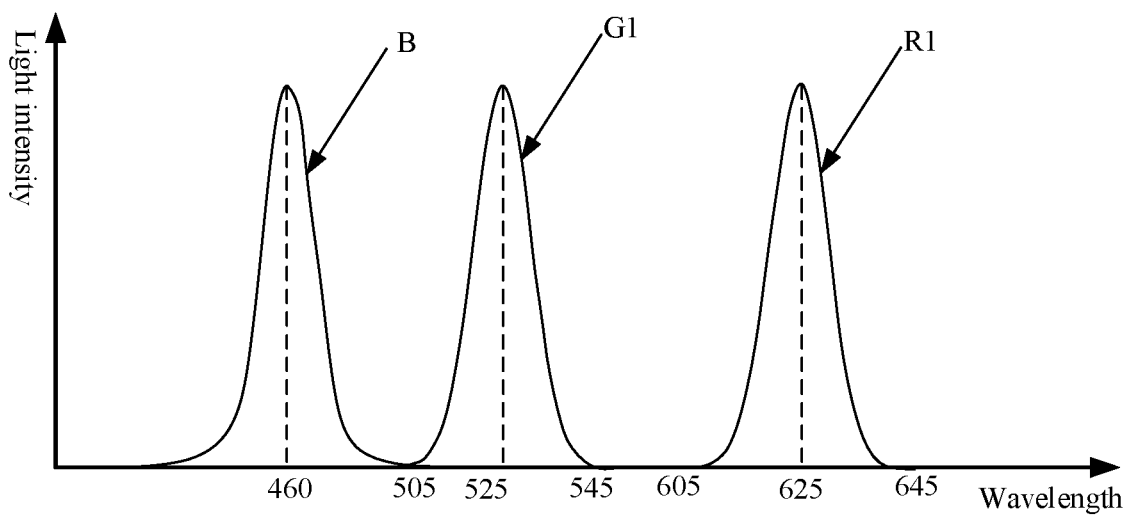
FIG. 7 is a spectrogram of red light, green light and blue light emitted from a display substrate according to an embodiment of the present disclosure.

Exemplarily, the embodiment of the present disclosure illustrates by taking the display substrate 1 is the InP QLED display substrate and light with the target wavelength in the emission spectrum of the electroluminescent device layer 12 is absorbed by the light-absorbing layer with reference to FIG. 5 to FIG. 7 as an example. FIG. 5 is a schematic diagram of emission spectra of a red light-emitting unit, a green light-emitting unit and a blue light-emitting unit of an electroluminescent device layer 12 according to an embodiment of the present disclosure. FIG. 6 is a schematic diagram of an absorption spectrum of a light-absorbing layer according to an embodiment of the disclosure. FIG. 7 is a spectrogram of red light (that is, light emitted by a red light-emitting unit and absorbed by a light-absorbing unit), green light (that is, light emitted by a green light-emitting unit and absorbed by the light-absorbing unit) and blue light (that is, light emitted by a blue light-emitting unit and absorbed by the light-absorbing unit) emitted from a display substrate 1. In FIG. 5 to FIG. 7, the abscissa indicates a wavelength with a unit of nm, and the ordinate indicates a light intensity with a unit of candela. As shown in FIG. 5, a peak wavelength of the emission spectrum R of the red light-emitting unit is 625 nm, a full width at half maximum of the emission spectrum of the red light-emitting unit is 55 nm, a peak wavelength of the emission spectrum G of the green light-emitting unit is 525 nm, a full width at half maximum of the emission spectrum of the green light-emitting unit is 55 nm, a peak wavelength of the emission spectrum B of the blue light-emitting unit is 460 nm, and a full width at half maximum of the emission spectrum of the glue light-emitting unit is 25 nm. As shown in FIG. 6, a wavelength of an absorption peak of the light-absorbing layer includes 500 nm, 550 nm, 600 nm and 650 nm. In conjunction with FIG. 5 to FIG. 7, supposing that the target difference threshold is 20 nm and the peak width of the absorption spectrum of the light-absorbing layer is 10 nm, when light emitted by the electroluminescent device 12 passes through the light-absorbing layer, light with the wavelength outside the range of 605 nm to 645 nm, for the emission spectrum R, is absorbed by the light-absorbing layer, and light with the wavelength outside the range of 505 nm to 545 nm, for the emission spectrum G, is absorbed by the light-absorbing layer. Therefore, the full width at half maximum of the emission spectrum R of the red light-emitting unit is changed into 40 nm (the spectrum R1 as shown in FIG. 7), the peak width of the spectrum R1 of red light emitted from the display substrate 1 is narrower, the full width at half maximum of the emission spectrum G of the green light-emitting unit is changed into 40 nm (the spectrum G1 as shown in FIG. 7), and the peak width of the spectrum G1 of green light emitted from the display substrate 1 is narrower. Accordingly, it may be determined that a color gamut of the display substrate is improved. It should be noted that in the embodiment of the present disclosure, for convenience for readers to view, the absorption spectrum of the light-absorbing layer is drawn upside down, that is, a positive direction of the ordinate in FIG. 6 is opposite to a positive direction of the ordinate in FIG. 5.

It should be noted that the light-absorbing material of the light-absorbing layer may be considered as a mixed material formed by mixing materials with different absorption peaks. For example, when the wavelength of the absorption peak of the light-absorbing layer includes 500 nm, 550 nm, 600 nm and 650 nm, the light-absorbing material of the light-absorbing layer may be considered as a mixed material formed by mixing four light-absorbing materials of which the wavelengths of the absorption peaks are 500 nm, 550 nm, 600 nm and 650 nm respectively. Due to different light of the target wavelength of the emission spectra of the light-emitting units of different colors, each of the mixed material only absorb light emitted by the light-emitting unit of one color in the light-absorbing material of the light-absorbing layer. For example, the absorption material with the 600 nm wavelength corresponding to the absorption peak only absorbs the target wavelength light of the emission spectrum of the red light-emitting unit, but not absorbs light emitted by the green light-emitting unit and light emitted by the blue light-emitting unit. In this way, the light-absorbing layer may be coated entirely without patterning, thus simplifying the manufacturing process of the light-absorbing layer and reducing the manufacturing cost.

Optionally, in the embodiment of the present disclosure, the display substrate 1 may be a self-luminescence display substrate, that is, the light-emitting units in the electroluminescent device layer 12 are self-luminescence units. At this time, the above light-absorbing layer may be used according to a use method of a color filter (CF) of a color-filter on array (COA) substrate, that is, light emitted by the light-emitting units of different colors is absorbed with different effects, thereby reducing the full width at half maximum of the emission spectrum of the light of different colors. Furthermore, since each material of the light-absorbing materials only absorbs light emitted by the light-emitting unit of one color and light of other colors is not affected by the material absorbing the light of a certain color, the light emission efficiency of the display substrate 1 can be effectively ensured. It can be seen from experiments that the loss of light emitted by the electroluminescent device layer 12 caused by the display substrate 1 according to the embodiment of the present disclosure is about 10%, which indicates that the loss of light caused by the display substrate 1 is small, thereby the light emission efficiency of the display substrate 1 according to the embodiment of the present disclosure is higher.

In the embodiment of the present disclosure, the above base substrate 11 may be a display backplane. The display backplane may be a low temperature poly-silicon (LTPS) backplane or an oxide backplane. The display backplane may include a glass substrate (or flexible substrate) and a thin film transistor (TFT) disposed on the glass substrate (or the flexible substrate). Moreover, a hydrophobic pixel defining layer of 1 to 2 microns may be used in the process of manufacturing the LTPS backplane to ensure the defining effect on a pixel unit. The TFT of the LTPS backplane is an LTPS TFT. The TFT of the oxide backplane is an oxide TFT. And the specific structure of the display backplane may be referenced to the related art, which is not described herein again in the embodiment of the present disclosure.

In summary, in the display substrate according to the embodiment of the present disclosure, the light-absorbing layer is arranged on the light-emitting side of the electroluminescent device layer, the electroluminescent device layer is configured to emit the initial light of the first color, wherein the initial light of the first color forms the target light of the first color after passing through the light-absorbing layer, and the full width at half maximum of the emission spectrum of the target light of the first color is less than the full width at half maximum of the emission spectrum of the initial light of the first color, such that the display substrate is provided with a wider color gamut. Furthermore, the light emission efficiency (also called luminous efficiency) of the display substrate depends on the peak value of the emission spectrum of the electroluminescent device layer, and in the embodiment of the present disclosure, the light-absorbing layer absorbs light with low light-emitting intensity in the emission spectrum of the electroluminescent device layer; thereby, the light-absorbing layer exerts less impact on the light emission efficiency of the display substrate.

The display substrate according to the embodiments of the present disclosure may be applicable to the following method. For the manufacturing method and manufacturing principle of the display substrate in the embodiments of the present disclosure, please refer to the description in the following embodiments.

An embodiment of the present disclosure provides a method for manufacturing a display substrate. The method is applicable to manufacturing the display substrates according to the above embodiments of the present disclosure. The method includes the following steps:

forming an electroluminescent device layer and a light-absorbing layer on a base substrate, and the light-absorbing layer is disposed on a light-emitting side of the electroluminescent device layer; wherein the electroluminescent device layer is configured to emit initial light of a first color, wherein the initial light forms target light of the first color after passing through the light-absorbing layer, and a full width at half maximum of an emission spectrum of the initial light of the first color is greater than a full width at half maximum of an emission spectrum of the target light of the first color.

In summary, in the display substrate manufactured by the method for manufacturing the display substrate according to the embodiment of the present disclosure, the light-absorbing layer is arranged on the light-emitting side of the electroluminescent device layer, the electroluminescent device layer is configured to emit the initial light of the first color, wherein the initial light of the first color forms the target light of the first color after passing through the light-absorbing layer, and the full width at half maximum of the emission spectrum of the target light of the first color is less than the full width at half maximum of the emission spectrum of the initial light of the first color, such that the display substrate is provided with a wider color gamut.

Optionally, the light-absorbing layer may be disposed on a side, distal from the base substrate, of the electroluminescent device layer. Accordingly, forming the electroluminescent device layer and the light-absorbing layer on the base substrate includes: forming the electroluminescent device layer on the base substrate, and forming the light-absorbing layer on the base substrate on which the electroluminescent device layer is formed. Alternatively, the light-absorbing layer is disposed on a side, proximal to the base substrate, of the electroluminescent device layer. Accordingly, forming the electroluminescent device layer and the light-absorbing layer on the base substrate includes: forming the light-absorbing layer on the base substrate, and forming the electroluminescent device layer on the base substrate on which the light-absorbing layer is formed.

When the light-absorbing layer is disposed on a side, distal from the base substrate, of the electroluminescent device layer, forming the electroluminescent device layer and the light-absorbing layer on the base substrate includes: forming a electroluminescent device layer on the base substrate, forming a package structure layer on the base substrate on which the electroluminescent device layer is formed, wherein the light-absorbing layer is disposed in the package structure layer.

In one embodiment, the package structure layer is doped with a light-absorbing material which is a material of the light-absorbing layer.

Exemplarily, the material of the light-absorbing layer is a light-absorbing material. Forming the package structure layer on the base substrate on which the electroluminescent device layer is formed includes: forming an inorganic layer and an organic layer that are stacked alternately on the base substrate on which the electroluminescent device layer is formed, wherein the organic layer is doped with the light-absorbing material.

In another embodiment, forming the package structure layer on the base substrate on which the electroluminescent device layer is formed includes: forming one or more sub-package structure layers sequentially on the base substrate on which the electroluminescent device layer is formed, forming a light-absorbing layer on the base substrate on which the one or more sub-package structure layers are formed, and forming one or more sub-packaging structures on the base substrate on which the light-absorbing layer is formed to obtain the package structure layer including the plurality of sub-package structure layers, wherein the light-absorbing layer is disposed between two of the plurality of sub-package structure layers. The plurality of sub-package structure layers include: inorganic layers and organic layers that are stacked alternately.

When the light-absorbing layer is disposed on a side, distal from the base substrate, of the electroluminescent device layer, and the display substrate further includes the package structure layer, forming the electroluminescent device layer and the light-absorbing layer on the base substrate includes: forming the electroluminescent device layer on the base substrate, forming the package structure layer on the base substrate on which the electroluminescent device layer is formed, and forming the light-absorbing layer on the base substrate on which the package structure layer is formed.

Alternatively, when the light-absorbing layer is disposed on a side, distal from the base substrate, of the electroluminescent device layer, and the display substrate further includes the package structure layer, forming the electroluminescent device layer and the light absorbing layer on the base substrate includes: forming the electroluminescent device layer on the base substrate, forming the light-absorbing layer on the base substrate on which the electroluminescent device layer is formed, and forming the package structure layer on the base substrate on which the light-absorbing layer is formed.

When the light-absorbing layer is disposed on a side, proximal to the base substrate, of the electroluminescent device layer, and the display substrate further includes a planarization layer, a material of the light-absorbing layer includes a light-absorbing material, and forming the electroluminescent device layer and the light-absorbing layer on the base substrate includes: forming the planarization layer on the base substrate by a planarization layer material doped with the light-absorbing material; and forming the electroluminescent device layer on the base substrate on which the planarization layer is formed. The planarization layer is provided with light-absorbing effect, thus the planarization layer is also called a light-absorbing layer.

When the light-absorbing layer is disposed on a side, proximal to the base substrate, of the electroluminescent device layer, and the display substrate further includes the planarization layer, forming the electroluminescent device layer and the light-absorbing layer on the base substrate includes: forming the planarization layer on the base substrate, forming the light-absorbing layer on the base substrate on which the planarization layer is formed, and forming the electroluminescent device layer on the base substrate on which the light-absorbing layer is formed.

When the light-absorbing layer is disposed on a side, proximal to the base substrate, of the electroluminescent device layer, and the display substrate further includes the planarization layer, forming the electroluminescent device layer and the light-absorbing layer on the base substrate includes: forming the light-absorbing layer on the base substrate, forming the planarization layer is on the base substrate on which the light-absorbing layer is formed, and forming the electroluminescent device layer on the base substrate on which the planarization structure layer is formed.

Furthermore, a material of the light-absorbing material may meet the condition that: an absorption spectrum of the light-absorbing layer is a shoulder peak of the emission spectrum of the initial light of the first color. Exemplarily, when the electroluminescent device layer includes: a red light-emitting unit, a green light-emitting unit and a blue light-emitting unit, wherein a peak wavelength of an emission spectrum of the red light-emitting unit is 625, a full width at half maximum of the emission spectrum of the red light-emitting unit is 55 nm, a peak wavelength of an emission spectrum of the green light-emitting unit is 525 nm, a full width at half maximum of the emission spectrum of the green light-emitting unit is 55 nm, a peak wavelength of an emission spectrum of the blue light-emitting unit is 460 nm, and a full width at half maximum of the emission spectrum of the blue light-emitting unit is 25 nm, a material of the light-absorbing material should meet the conditions that: a wavelength of an absorption peak of the light-absorbing layer includes: 500 nm, 550 nm, 600 nm and 650 nm, and a peak width of an absorption spectrum of the light-absorbing layer is 10 nm.

For example, a material of the light-absorbing layer includes at least one of modified anthocyanin and modified anthocyanidin. The modified anthocyanin is obtained by modifying absorption peak of the anthocyanin, and the modified anthocyanidin is obtained by modifying absorption peak of the anthocyanidin.

Further, the electroluminescent device layer may be an indium phosphide quantum dot light-emitting diode layer or an organic light-emitting diode layer.

All of the above optional embodiments may be combined arbitrarily to form optional embodiments of the present disclosure, and will not be described in detail herein.

Figure 8:
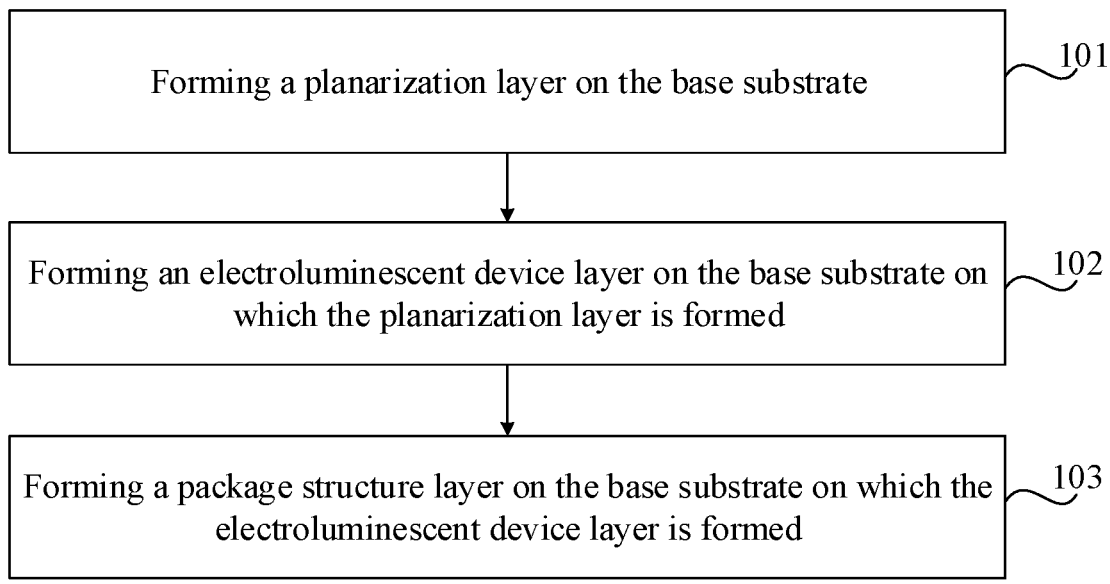
FIG. 8 is a flowchart of another method for manufacturing a display substrate according to an embodiment of the present disclosure.

FIG. 8 shows a flowchart of another method for manufacturing the display substrate according to an embodiment of the present disclosure. The method is applicable to manufacturing the display substrate 1 as shown in any one of FIG. 1 to FIG. 4. As shown in FIG. 8, the method may include the following steps:

In step 101, a planarization layer is formed on the base substrate.

Figure 9:
FIG. 9 is a schematic structural diagram after a planarization layer is formed on a base substrate according to an embodiment of the present disclosure.

FIG. 9 shows a schematic structural diagram after a planarization layer 15 is formed on a base substrate 11 according to an embodiment of the present disclosure. The base substrate 11 may be a display backplane. The display backplane may be a low temperature poly-silicon (LTPS) backplane or an oxide backplane. The display backplane may include a glass substrate (or a flexible substrate) and a TFT disposed on the glass substrate (or a flexible substrate). The TFT of the LTPS backplane is an LTPS TFT, and the TFT of the oxide backplane is an oxide TFT. Moreover, the planarization layer 15 may be disposed on a side, with the TFT, of the base substrate 11. Optionally, a material of the planarization layer 15 may include resin.

A method for manufacturing a display substrate according to the embodiment of the present disclosure may be used to manufacture the display substrate 1 as shown in any one of FIG. 1 to FIG. 4. In the display substrate 1 shown in FIG. 4, the planarization layer 15 is doped with a light-absorbing material. In the display substrates 1 shown in FIG. 1 to FIG. 3, the planarization layer 15 is not doped with the light-absorbing material. Depending on whether the planarization layer 15 is doped with the light-absorbing material, forming the planarization layer 15 on the base substrate 11 may include the following two cases.

In the first case, one layer of resin may be deposited on the base substrate 11 by deposition, coating or sputtering, or the like to serve as the planarization layer 15. At this time, the first case may be suitable for manufacturing the planarization layer 15 in the display substrate 1 shown in any one of FIG. 1 to FIG. 3.

In the second case, firstly, a light-absorbing material and resin may be mixed to obtain a mixed material, and then one layer of the mixed material is deposited on the base substrate 11 by deposition, coating or sputtering, or the like to obtain the planarization layer 15 doped with the light-absorbing material. Since the light-absorbing material in the planarization layer 15 may absorb light, the planarization layer 15 is also called a light-absorbing layer. At this time, in the second case, the light-absorbing material is a mixed material formed by mixing the light-absorbing materials with different wavelengths corresponding to absorption peaks. The second case may be suitable for manufacturing the planarization layer 15 in the display substrate 1 shown in FIG. 4.

In step 102, an electroluminescent device is formed on the base substrate on which the planarization layer is formed.

Figure 10:
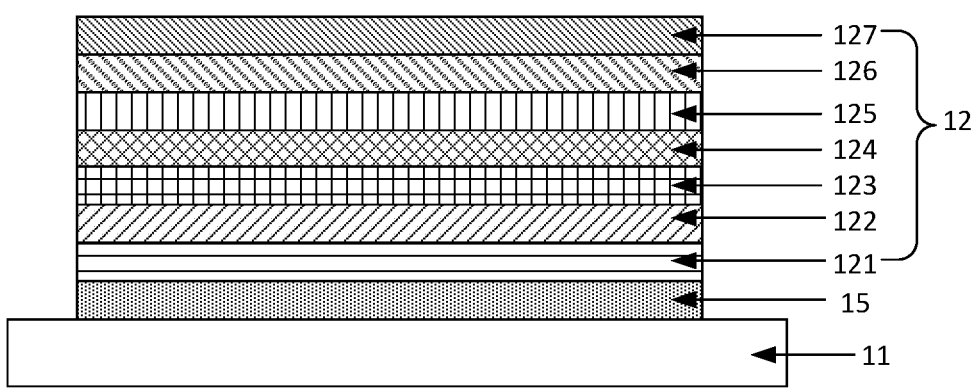
FIG. 10 is a schematic structural diagram after an electroluminescent device layer is formed on a base substrate on which a planarization layer is formed according to an embodiment of the present disclosure.

Exemplarily, FIG. 10 is a schematic structural diagram after an electroluminescent device layer 12 is formed on a base substrate 11 on which a planarization layer 15 is formed according to an embodiment of the present disclosure. The electroluminescent device layer 12 is disposed on a side, distal from the base substrate 11, of the planarization layer 15. The electroluminescent device layer 12 may include: a first electrode layer 121, a hole injection layer 122, a hole transport layer 123, an electroluminescent device layer 124, an electron transport layer 125, an electron injection layer 126 and a second electrode 127 that are sequentially stacked in a direction distal from the base substrate 11. A material of the first electrode layer 121 may include ITO. A material of the hole injection layer 122 may include a hole injection material, for example, tetrafluorocyano-quinone dimethane. A material of the hole transport layer 123 may include a hole transport material, for example, PEDOT/PSS. A material of the electroluminescent device layer 124 may include an InP quantum dot material. A material of the electron transport layer 125 may include an electron transport material, for example, a zinc oxide nanoparticle. A material of the electron injection layer 126 may include an electron injection material, for example, coumarin 545T. A material of the second electrode layer 127 may include Al, Ag, or Mg/Ag.

In one embodiment, forming the electroluminescent device layer 12 on the base substrate 11 on which the planarization layer 15 is formed may include the following steps:

In step (1), one layer of ITO is deposited by magnetron sputtering, thermal evaporation, plasma enhanced chemical vapor deposition (PECVD), or the like on the base substrate 11 on which the planarization layer 15 is formed, an ITO material layer is obtained, and the ITO material layer is treated in one patterning process to obtain a first electrode layer 121.

In step (2), a hole injection material solution is printed by inkjet printing on the base substrate 11 on which the first electrode layer 121 is formed, and a hole injection layer 122 is obtained by drying.

In Step (3), a hole transport material solution is printed by inkjet printing on the base substrate 11 on which the hole injection layer 122 is formed, and a hole transport layer 123 is obtained by drying.

In step (4), an InP quantum dot material solution is printed by inkjet printing on the base substrate 11 on which the hole transport layer 123 is formed, and an electroluminescent device layer 124 is obtained by drying treatment.

In step (5), an electron transport material is evaporated by evaporation on the base substrate 11 on which electroluminescent device layer 124 is formed, and an electron transport layer 125 is obtained.

In step (6), an electron injection material is evaporated by evaporation on the base substrate 11 on which the electron transport layer 125 is formed, and an electron injection layer 126 is obtained.

In step (7), one layer of Al is deposited by magnetron sputtering, thermal evaporation, PECVD, or the like on the base substrate 11 on which the electron injection layer 126 is formed, and an Al material layer is obtained, and then the Al material layer is treated in one patterning process to obtain a second electrode layer 127.

In step 103, a package structure layer is formed on the base substrate on which the electroluminescent device layer is formed.

The package structure layer may be a thin film package layer or a package cover plate. When the package structure layer is the thin film package layer, the package structure layer may include inorganic layers and organic layers that are stacked alternately. A material of the inorganic layer may include silicon oxide (SiOx), and a material of the organic layer may include polyimide (PI). Optionally, the embodiment of the present disclosure is described by taking the case where the package structure layer is the thin film package layer as an example, then FIG. 2 may be a schematic diagram after a package structure layer is formed on a base substrate on which an electroluminescent device layer is formed. The following description is given by taking manufacturing the package structure layer 14 in FIG. 2 as an example. Exemplarily, forming the packaging layer 14 on the base substrate 11 on which the electroluminescent device layer 12 is formed may include the following steps:

In step (1), one layer of SiOx is deposited on the base substrate 11 on which the electroluminescent device layer 12 is formed by deposition, coating or sputtering, or the like to obtain an inorganic layer 141.

In step (2), a light-absorbing material and an organic material are mixed to obtain a mixed material, and one layer of the mixed material is deposited on the base substrate 11 on which the inorganic layer 141 is formed by deposition, coating or sputtering, or the like to obtain an organic layer 142.

In step (3), one layer of SiOx is deposited on the base substrate 11 on which the organic layer 142 is formed by deposition, coating or sputtering, or the like to obtain an inorganic layer 143.

It should be noted that the step 103 illustrates by taking manufacturing the package structure layer 14 in FIG. 2 as an example. When the package structure layers 14 in FIG. 1, FIG. 3 and FIG. 4 are thin film package layers, processes of manufacturing the package structure layers 14 in FIG. 1, FIG. 3 and FIG. 4 may be referenced to a process of manufacturing the package structure layer 14 in FIG. 2. The difference is that when the package structure layers 14 in FIG. 1, FIG. 3 and FIG. 4 are manufactured, the organic layer is formed only by depositing an organic material, without mixing a light-absorbing material in the organic material.

It should be noted that the display substrate 1 in FIG. 1 is a top-emitting display substrate and includes a light-absorbing layer 13 disposed on a side, distal from the base substrate 11, of the electroluminescent device layer 12. Therefore, when the display substrate shown in FIG. 1 is manufactured, before the step 103, the method further includes: forming the light-absorbing layer 13 on the base substrate 11 on which the electroluminescent device layer 12 is formed. Exemplarily, one layer of light absorbing material is deposited on the base substrate 11 on which the electroluminescent device layer 12 is formed by deposition, coating or sputtering, or the like to serve as the light absorbing layer 13.

The display substrate 1 shown in FIG. 3 is a bottom-emitting display substrate and includes a light-absorbing layer 13 disposed between the electroluminescent device layer 12 and the base substrate 11. Therefore, when the display substrate shown in FIG. 3 is manufactured, before the step 102, the method further includes: forming the light-absorbing layer 13 on the base substrate on which the planarization layer 15 is formed. Exemplarily, one layer of light-absorbing material is deposited on the base substrate 11 on which the planarization layer 15 is formed by deposition, coating or sputtering, or the like to serve as the light-absorbing layer 13.

In the method for manufacturing the display substrate according to the embodiment of the present disclosure, one patterning process includes photoresist coating, exposure, developing, etching and photoresist stripping. Treating the material layer (for example, the ITO material layer) in one patterning process includes: coating the material layer (for example, the ITO material layer) with one layer of photoresist to form a photoresist layer, exposing the photoresist layer by a mask to form a complete exposure region and a non-exposure region on the photoresist, then treating the photoresist layer by a developing process to completely remove the photoresist in the complete exposure region and remain all photoresist in the non-exposure region, etching a region corresponding to the complete exposure region on the material layer (for example, the ITO material layer) by an etching process, and finally stripping the photoresist in the non-exposure region to obtain a corresponding structure (for example, a first electrode layer). A positive photoresist is used as an example to illustrate. When the photoresist is a negative photoresist, for the process of one patterning process, reference may be made to the description in this paragraph, which is not described herein again in this embodiment of the present disclosure.

The sequence of the steps of the method for manufacturing the display substrate provided in the embodiments of the present disclosure may be properly adjusted, and the steps may also be increased or decreased according to a case. Method to which mortifications readily figured out by those skilled in the art within the technical scope disclosed by the present disclosure shall fall within the protection scope of the present disclosure. Therefore, details are not described herein.

In summary, in the display substrate manufactured by a method for manufacturing the display substrate according to the embodiment of the present disclosure, the light-absorbing layer is arranged on the light-emitting side of the electroluminescent device layer, the electroluminescent device layer is configured to emit the initial light of the first color, wherein the initial light of the first color forms the target light of the first color after passing through the light-absorbing layer, and the full width at half maximum of the emission spectrum of the target light of the first color is less than the full width at half maximum of the emission spectrum of the initial light of the first color, such that the display substrate is provided with a wider color gamut. Furthermore, the light emission efficiency of the display substrate depends on the peak value of the emission spectrum of the electroluminescent device layer, and in the embodiment of the present disclosure, the light-absorbing layer absorbs light with low light-emitting intensity in the emission spectrum of the electroluminescent device layer, therefore, the light-absorbing layer exerts less impact on the light emission efficiency of the display substrate.

The embodiments of the present disclosure also provide a display device. The display device may include the display substrate according to the above embodiments of the device. The display device may be an InP quantum dot light-emitting diode display device or an organic light-emitting diode display device. For example, the display device may be a touch screen, a display, a mobile phone, a tablet computer, a television, a notebook computer, a digital photo frame, or a navigator product or component using the InP quantum dot light-emitting diode display device or the organic light-emitting diode display device.

Other embodiments of the present disclosure will be apparent to those skilled in the art from consideration of the specification and practice of the present disclosure. The present disclosure is intended to cover any variations, uses, or adaptations of the present disclosure following the general principles thereof and including common knowledge or commonly used technical measures which are not disclosed herein. The specification and embodiments are to be considered as exemplary only, and the true scope and spirit of the present disclosure are indicated by the claims.

It should be understood that the present disclosure is not limited to the exact construction that has been described above and illustrated in the accompanying drawings, and that various modifications and changes can be made without departing from the scope thereof. The scope of the present disclosure is only limited by the appended claims.

What is claimed is:

1. A display substrate, comprising:
a base substrate, an electroluminescent device layer on the base substrate, and a light-absorbing layer on a light-emitting side of the electroluminescent device layer; wherein
the electroluminescent device layer is configured to emit initial light of a first color, wherein the initial light forms target light after passing through the light-absorbing layer, a full width at half maximum of an emission spectrum of the initial light is greater than a full width at half maximum of an emission spectrum of the target light, and the light-absorbing layer is on a side, distal from the base substrate, of the electroluminescent device layer.

2. The display substrate according to claim 1, further comprising: a package structure layer on a side, distal from the base substrate, of the electroluminescent device layer, wherein the light-absorbing layer is in the package structure layer.

3. The display substrate according to claim 2, wherein a material of the light-absorbing layer comprises a light-absorbing material, wherein the package structure layer is doped with the light-absorbing material.

4. The display substrate according to claim 3, wherein the package structure layer comprises: an inorganic layer and an organic layer that are stacked alternately, wherein the organic layer is doped with the light-absorbing material.

5. The display substrate according to claim 2, wherein the package structure layer comprises: a plurality of sub-package structure layers, wherein the light-absorbing layer is between two of the plurality of sub-package structure layers.

6. The display substrate according to claim 1, further comprising: a package structure layer on the side, distal from the base substrate, of the electroluminescent device layer, wherein the light-absorbing layer is on a side, distal from the base structure, of the package structure layer.

7. The display substrate according to claim 1, further comprising: a package structure layer on a side, distal from the base substrate, of the light-absorbing layer.

8. The display substrate according to claim 1, wherein the light-absorbing layer is on a side, proximal to the base substrate, of the electroluminescent device layer.

9. The display substrate according to claim 8, wherein a material of the light-absorbing layer comprises a light-absorbing material, and the display substrate further comprises: a planarization layer between the base substrate and the electroluminescent device layer, wherein the planarization layer is doped with the light-absorbing material.

10. The display substrate according to claim 8, further comprising: a planarization layer on a side, proximal to the electroluminescent device layer, of the base substrate, wherein the light-absorbing layer is between the planarization layer and the electroluminescent device layer.

11. The display substrate according to claim 8, further comprising: a planarization layer on the side, proximal to the base substrate, of the electroluminescent device layer, wherein the light-absorbing layer is between the planarization layer and the base substrate.

12. The display substrate according to claim 1, wherein an absorption spectrum of the light-absorbing layer comprises a shoulder peak of an emission spectrum of the initial light.

13. The display substrate according to claim 12, wherein the electroluminescent device layer comprises at least one of a red light-emitting unit, a green light-emitting unit, and a blue light-emitting unit; wherein
- a peak wavelength of an emission spectrum of the red light-emitting unit is 625 nanometers, and a full width at half maximum of the emission spectrum of the red light-emitting unit is 55 nanometers;
- a peak wavelength of an emission spectrum of the green light-emitting unit is 525 nanometers, and a full width at half maximum of the emission spectrum of the green light-emitting unit is 55 nanometers;
- a peak wavelength of an emission spectrum of the blue light-emitting unit is 460 nanometers, and a full width at half maximum of the emission spectrum of the blue light-emitting unit is 25 nanometers; and
- a wavelength of an absorption peak of the light-absorbing layer comprises: 500 nanometers, 550 nanometers, 600 nanometers, and 650 nanometers, and a peak width of an absorption spectrum of the light-absorbing layer is 10 nanometers.

14. The display substrate according to claim 1, wherein a material of the light-absorbing layer comprises at least one of modified anthocyanin and modified anthocyanidin, wherein the modified anthocyanin is obtained by modifying an absorption peak of the anthocyanin, and the modified anthocyanidin is obtained by modifying an absorption peak of the anthocyanidin.

15. The display substrate according to claim 1, wherein the electroluminescent device layer comprises one of an indium phosphide quantum dot light-emitting diode layer and an organic light-emitting diode layer.

16. A method for manufacturing a display substrate, comprising:
- forming an electroluminescent device layer and a light-absorbing layer on the base substrate, wherein the light-absorbing layer is on a light-emitting side of the electroluminescent device layer; wherein
- the electroluminescent device layer is configured to emit initial light of a first color, wherein the initial light forms target light after passing through the light-absorbing layer, a full width at half maximum of an emission spectrum of the initial light is greater than a full width at half maximum of an emission spectrum of the target light, and the light-absorbing layer is on a side, distal from the base substrate, of the electroluminescent device layer.

17. The method according to claim 16, wherein an absorption spectrum of the light-absorbing layer comprises a shoulder peak of an emission spectrum of the initial light.

18. A display device, comprising the display substrate as defined in claim 1.

* * * * *